United States Patent
Chang et al.

(10) Patent No.: US 12,334,470 B2
(45) Date of Patent: Jun. 17, 2025

(54) CHIP PACKAGING STRUCTURE AND RELATED INNER LEAD BONDING METHOD

(71) Applicant: Sitronix Technology Corp., Hsinchu County (TW)

(72) Inventors: Ying-Chen Chang, Hsinchu County (TW); Po-Chi Chen, Hsinchu County (TW); Kuo-Wei Tseng, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 0 days.

(21) Appl. No.: 16/916,136

(22) Filed: Jun. 30, 2020

(65) Prior Publication Data
US 2020/0335474 A1    Oct. 22, 2020

Related U.S. Application Data

(63) Continuation of application No. 15/792,767, filed on Oct. 25, 2017, now abandoned.

(Continued)

(51) Int. Cl.
*H01L 23/498*  (2006.01)
*H01L 23/00*   (2006.01)

(52) U.S. Cl.
CPC ............. *H01L 24/81* (2013.01); *H01L 24/11* (2013.01); *H01L 24/16* (2013.01); *H01L 24/29* (2013.01); *H01L 24/32* (2013.01); *H01L 23/49811* (2013.01); *H01L 23/49838* (2013.01); *H01L 23/4985* (2013.01); *H01L 24/05* (2013.01); *H01L 24/13* (2013.01); *H01L 2224/0401* (2013.01); *H01L 2224/05567* (2013.01); *H01L 2224/13007* (2013.01); *H01L 2224/13013* (2013.01); *H01L 2224/13019* (2013.01); *H01L 2224/13021* (2013.01); *H01L 2224/13144* (2013.01); *H01L 2224/16013* (2013.01); *H01L 2224/16014* (2013.01); *H01L 2224/16113* (2013.01); *H01L 2224/16145* (2013.01); *H01L 2224/16225* (2013.01);

(Continued)

(58) Field of Classification Search
None
See application file for complete search history.

(56) References Cited

U.S. PATENT DOCUMENTS 5,108,950 A    4/1992   Wakabayashi
5,889,326 A    3/1999   Tanaka (Continued)

FOREIGN PATENT DOCUMENTS

CN    101131987 A    2/2008
CN    101350314 A    1/2009

(Continued)

*Primary Examiner* — Cory W Eskridge
(74) *Attorney, Agent, or Firm* — Winston Hsu

(57) ABSTRACT

A chip packaging structure includes a chip and a film substrate. The chip is formed with a gold bump, and the film substrate is formed with an inner lead, wherein the gold bump includes a first bonding surface and a plurality of side walls. The gold bump is electrically connected to the inner lead through a eutectic material coverage layer, and the first bonding surface and at least one of the plurality of side walls are covered by the eutectic material coverage layer.

10 Claims, 10 Drawing Sheets

Related U.S. Application Data

(60) Provisional application No. 62/412,825, filed on Oct. 25, 2016.

(52) U.S. Cl.
CPC ........... *H01L 2224/16238* (2013.01); *H01L 2224/16502* (2013.01); *H01L 2224/73253* (2013.01); *H01L 2224/81097* (2013.01); *H01L 2224/81193* (2013.01); *H01L 2224/81345* (2013.01); *H01L 2224/81444* (2013.01); *H01L 2224/81447* (2013.01); *H01L 2224/81805* (2013.01)

(56) References Cited

U.S. PATENT DOCUMENTS

| | | | | |
|---|---|---|---|---|
| 2004/0251546 | A1* | 12/2004 | Lee | B23K 35/262 257/738 |
| 2006/0055021 | A1* | 3/2006 | Yamamoto | H01L 23/4985 257/E21.503 |
| 2012/0098120 | A1* | 4/2012 | Yu | H01L 24/13 257/737 |
| 2013/0277830 | A1* | 10/2013 | Yu | H01L 24/16 257/737 |
| 2015/0130051 | A1* | 5/2015 | Huang | H01L 24/14 257/737 |

FOREIGN PATENT DOCUMENTS

| | | |
|---|---|---|
| CN | 100539055 C | 9/2009 |
| CN | 100541774 C | 9/2009 |
| CN | 102915989 A | 2/2013 |
| JP | 56-45044 A | 4/1981 |
| JP | 59-46416 B2 | 11/1984 |
| JP | 11-345840 A | 12/1999 |
| JP | 2001-176918 A | 6/2001 |
| JP | 2005-203388 A | 7/2005 |
| JP | 2008-218927 A | 9/2008 |
| KR | 10-2004-0107060 A | 12/2004 |
| TW | 200837852 | 9/2008 |

\* cited by examiner

CHIP PACKAGING STRUCTURE AND RELATED INNER LEAD BONDING METHOD

CROSS REFERENCE TO RELATED APPLICATIONS

This is a continuation application of U.S. application Ser. No. 15/792,767, filed Oct. 25, 2017, which claims the benefit of U.S. Provisional Application No. 62/412,825, filed on Oct. 25, 2016 and is included in its entirety herein by reference.

BACKGROUND OF THE INVENTION

1. Field of the Invention

The present invention relates to a chip packaging structure and related lead bonding method, and more particularly, to a chip packaging structure and a related lead bonding method using non-embedded bonding.

2. Description of the Prior Art

Chip on Film (COF) packaging is a technique that performs flip chip bonding onto a film substrate to replace wire bonding. Through COF packaging, the film substrate is utilized as a base substrate of the chip, and gold bumps of the chip can be connected to leads of the film substrate by performing inner lead bonding to directly place the chip and relative electronic elements on the film substrate. Therefore, the conventional printed circuit board can be replaced by the film substrate to achieve small, light and compact designs.

In order to meet the requirements of chip performance (e.g., high resolution and channel number) or more compact design, the lead bonding faces the challenges of high pin count and fine pitch design. Considering the precision of fine pitch for inner lead bonding, parameters such as lead size, gold bump size, eutectic material, bonding stress and welding temperature shall be taken into analysis and optimizations to reach good conductivity, mechanical bonding and reliability between the lead and gold bump.

FIG. 1 illustrates a first perspective view (along a Y direction) of a chip packaging structure 1 performing lead bonding onto an XZ plane. The chip packaging structure 1 includes a chip 10, a gold bump 11, a lead 12 and a film substrate 13. The chip 10 includes a die 100, at least one pad 101 and a passivation layer 102.

The pad 101 is electrically connected to the die 100 and used as a signal channel of the die 100. The die 100 is covered by the passivation layer 102, wherein the passivation layer 102 is formed with a passivation opening 103 used as a connection path between the pad 101 and the gold bump 11. Under the structure design of the passivation opening 103, when the gold bump 11 is heated up to be in liquid state and formed on the chip 10, the gold bump 11 in liquid state is formed with a hollow 113, wherein an area of the passivation opening 103 is associated with a proportion of areas of the hollow 113 and a total surface (e.g., 95%). On the other hand, the lead 12 is formed on the film substrate 13 and formed with a flat surface.

The gold bump 11 and the lead 12 may be soldered together through thermo-compression bonding. Further, in order to maximize a contact area for the hollow 113 of the gold bump 11 and the lead 12, a pressure or stress will be applied to the lead 12 to embed the lead 12 into the gold bump 11 when performing the thermo-compression bonding. Therefore, the lead 12 is firmly bonded with the hollow 113 of the gold bump 11, which ensures the bonding strength between the gold bump 11 and the lead 12 to avoid loss of contact and poor contact issues due to shipment or process failures of the chip packaging structure 1. However, the thermo-compression bonding brings damage risk to the chip packaging structure 1 to reduce yield rate. For example, the applied pressure or stress may damage elements beneath the gold bump 11, such as the pad 101, the passivation layer 102 and the die 100, which leads damage to the chip packaging structure 1.

Further, the width of the gold bump 11 shall be greater than the width of the lead 12 to make sure that the lead 12 is able to be embedded into the gold bump 11 to ensure the bonding strength. However, with wider width of the gold bump 11, the number of channels per unit area is decreased and an amount of material usage of the gold bump 11 is increased, leading to increase production cost.

Therefore, there is a need to provide a chip packaging structure and related lead bonding method to meet the requirements above mentioned.

SUMMARY OF THE INVENTION

It is therefore an objective of the present invention to provide a chip packaging structure and related inner lead bonding method to meet the requirements above mentioned.

The present invention discloses a chip packaging structure includes a chip formed with a gold bump, and a film substrate formed with a lead, wherein the gold bump comprises a first bonding surface and a plurality of side walls, the gold bump is electrically connected to the lead through a eutectic material coverage, and the first bonding surface and at least one of the plurality of side walls are covered by the eutectic material coverage.

The present invention further discloses a lead bonding method for a chip packaging structure, wherein the chip packaging structure comprises a chip and a film substrate. The method includes making a first bonding surface of a gold bump of the chip contact with a lead of the film substrate, heating the gold bump and the lead up to a temperature range to form a eutectic material coverage between the gold bump and the lead, and holding on for a predetermined period to make the first bonding surface, second bonding surface and at least one of the plurality of side walls covered by the eutectic material coverage.

The present invention utilizes a capillary effect happened to the eutectic material coverage 24 formed on the surface of the gold bump, which allows the eutectic material coverage flowing to the bonding surface and at least one side walls of the gold bump without any applied stress to increase the area of eutectic material coverage. Therefore, the present invention realizes non-embedded bonding to improve bonding strength between the lead and the gold bump, reduce bonding impedance, enhance resistance to deformation, ensure structure intactness, and reduce short risk. Moreover, in the chip packaging structure of the present invention, the sizes of the lead and the gold bump are decreased to realize fine pitch, improve potting glue fluidity, increase space for heat dissipation, save material usage, increase packaging precision (tolerance) and decrease short risk due to test pin burr.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
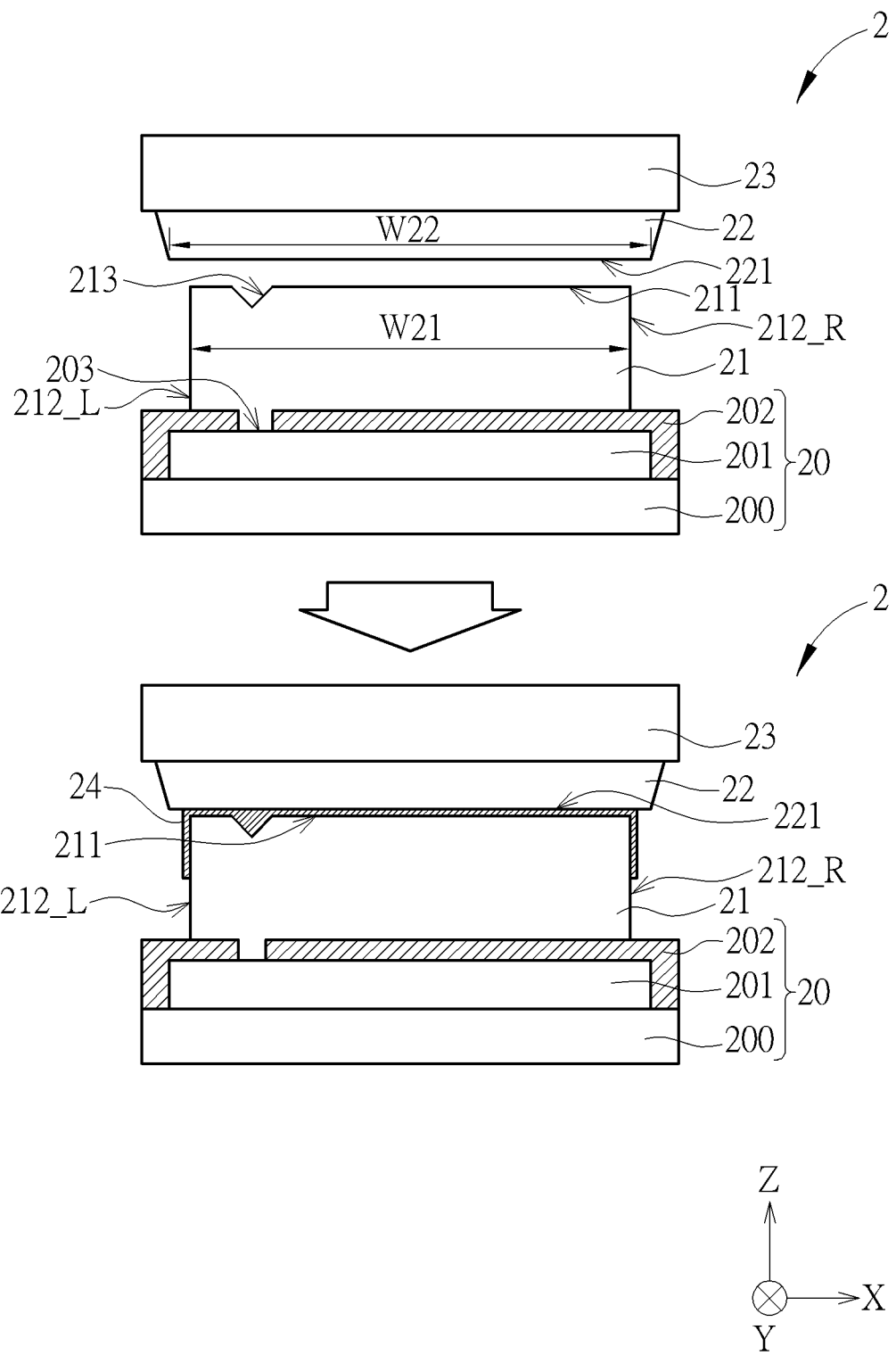
FIG. 2 illustrates a first perspective view (along the Y direction) of a chip packaging structure performing lead bonding onto the XZ plane according to an embodiment of the present invention.

FIG. 2 illustrates a first perspective view (along a Y direction) of a chip packaging structure performing lead bonding onto an XZ plane according to an embodiment of the present invention. The chip packaging structure 2 includes a chip 20, a gold bump 21, a lead 22 and a film substrate 23. The chip 20 includes a die 200, at least one pad 201, and a passivation layer 202. The lead 22 is formed on the film substrate 23.

The gold bump 21 extends along the Y direction and incudes a first bonding surface 211 and a plurality of side walls. Each of the plurality of side walls is connected to the first bonding surface 211 and is surfaces of the gold bump 21. The lead 22 is extended along the Y direction and includes a second bonding surface 221. The first bonding surface 211 of the gold bump 21 faces the second bonding surface 221 of the lead 22 to bond the gold bump 21 and the lead 22. For example, the second bonding surface 221 of the lead 22 faces a −Z direction to bond with the first bonding surface 211 of the gold bump 21.

The pad 201 is electrically connected to the die 200 and used as a signal path of the die 200. The die 200 is covered by the passivation layer 202, wherein the passivation layer 202 is formed with a passivation opening 203 used as a connection path between the pad 201 and the gold bump 21.

Figure 1:
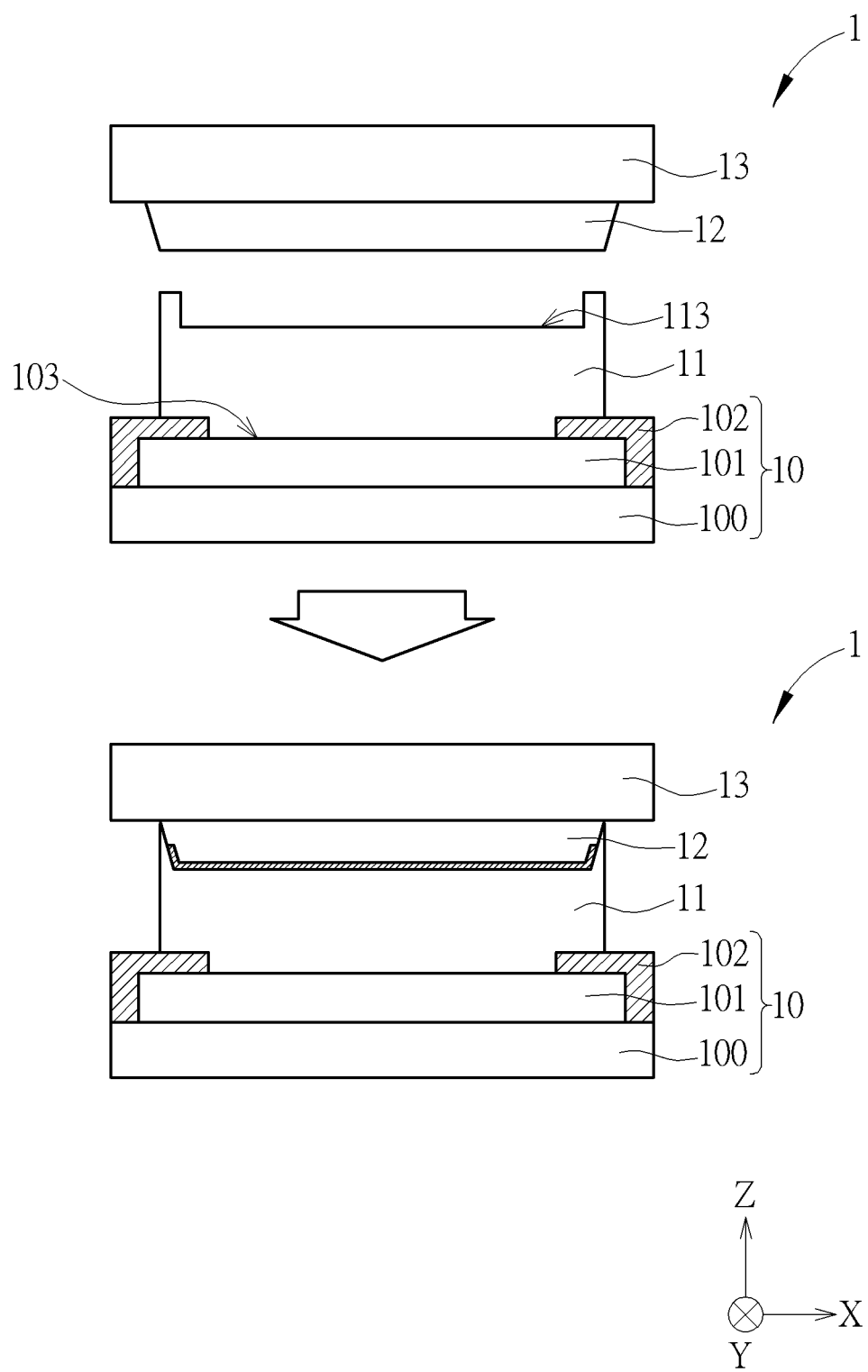
FIG. 1 illustrates a first perspective view (along a Y direction) of a chip packaging structure performing lead bonding onto an XZ plane.

Noticeably, compared with the passivation opening 103 of FIG. 1, decreasing the area (on an XY plane) of the passivation opening 203 of the passivation layer 202 may decrease the proportion of the hollow 213 of the gold bump 21 and the total surface (e.g., 5%), and thus the first bonding surface 211 of the gold bump 21 can be nearly flat to be approximated as a plane. On the other hand, the lead 22 is formed on the film substrate 23 with a flat surface.

A eutectic material coverage (EMC) 24 is formed between the gold bump 21 and the lead 22, a part of the gold bump 21 and a part of the lead 22 may be combined with the eutectic material coverage 24 through heating up for a period to form alloys of eutectic material, gold and copper (lead). Since the first bonding surface 211 of the gold bump 21 is approximated as a plane and the hollow 213 may be filled up by the eutectic material coverage 24, the gold bump 21 may be electrically connected to the lead 22 through the eutectic material coverage 24, and the first bonding surface 211, the second bonding surface 221 and at least one of the plurality of side walls are covered by the eutectic material coverage 24.

The plurality of side walls of the gold bump 21 includes a first side wall 212_L and a second side wall 212_R. The first side wall 212_L and the second side wall 212_R are parallel to a YZ plane, and perpendicular to the first bonding surface 221 (e.g., the XY plane) and an X direction. The first side wall 212_L and the second side wall 212_R are covered by the eutectic material coverage 24. In such a structure, the bonding between the gold bump 21 and the lead 22 is resistive to a force along the X direction to enhance bonding strength.

The plurality of side walls of the gold bump 21 further includes a third side wall 212_B parallel to the XZ plane, and perpendicular to the first bonding surface 221 and the Y direction. The third side wall 212_B is covered by the eutectic material coverage 24. In such a structure, the bonding between the gold bump 21 and the lead 22 is resistive to a force along the Y direction to enhance bonding strength.

When bonding the gold bump 21 and the lead 22, the first bonding surface 211 of the gold bump 21 is made to contact with the second bonding surface 221 of the lead 22, then the gold bump 21 and the lead 22 are heated up to a temperature range for forming the eutectic material coverage 24 between the gold bump and the lead, and finally the gold bump 21 and the lead 22 are held on contacted for a predetermined period to make the first bonding surface 211, the second bonding surface 221 and at least one of the plurality of side walls 212_L, 212_R and 212_B covered by the eutectic material coverage 24. In one embodiment, the temperature range is from 400 to 500 Celsius degrees, the predetermined period is from 0.1 to 2 seconds. Since the first bonding surface 211 of the gold bump 21 is approximated to a plane and the small hollow 213 may be filled up by the eutectic material coverage 24, the bonding strength may be ensured by contacting the first bonding surface 211 with the second bonding surface 221.

The width W21 of the gold bump 21 and the width W22 of the lead 22 respectively refer to the sizes of the lead 22 and the gold bump 21 along the X direction, wherein the X, Y, and Z directions are perpendicular to each other. In one embodiment, the width W21 of the gold bump 21 may be smaller than or equal to the width W22 of the lead 22, which allows the chip packaging structure 2 to perform lead bonding without applied stress.

In the chip packaging structure 1 of FIG. 1, the width of the gold bump 11 is greater than the width of the lead 12, which reduces channel number per unit area and also increases material usage of the gold bump 11 to increase production cost. In comparison, in the chip packaging structure 2, the width 21 of the gold bump 21 is smaller than or equal to the width W22 of the lead 22, which increases channel number per unit area and also decreases material usage of the gold bump 21 to save production cost.

The chip packaging structure 2 of the present invention performs lead bonding to the bonding gold bump 21 and the lead 22 by making the eutectic material coverage 24 cover the first bonding surface 211, the second bonding surface 221 and at least one of the plurality of side walls 212_L, 212_R and 212_B. Therefore, by making the first bonding surface 211 of the gold bump 21 contact with the second bonding surface 221 of the lead 22 is enough for performing lead bonding, and there is no need to apply stress for embedding the lead 22 into the gold bump 21. As a result, bonding stress and pressure analysis is avoided to effectively simplify process steps, and structure damage due to applying stress can be prevented, so as to realize non-embedded bonding.

Figure 3:
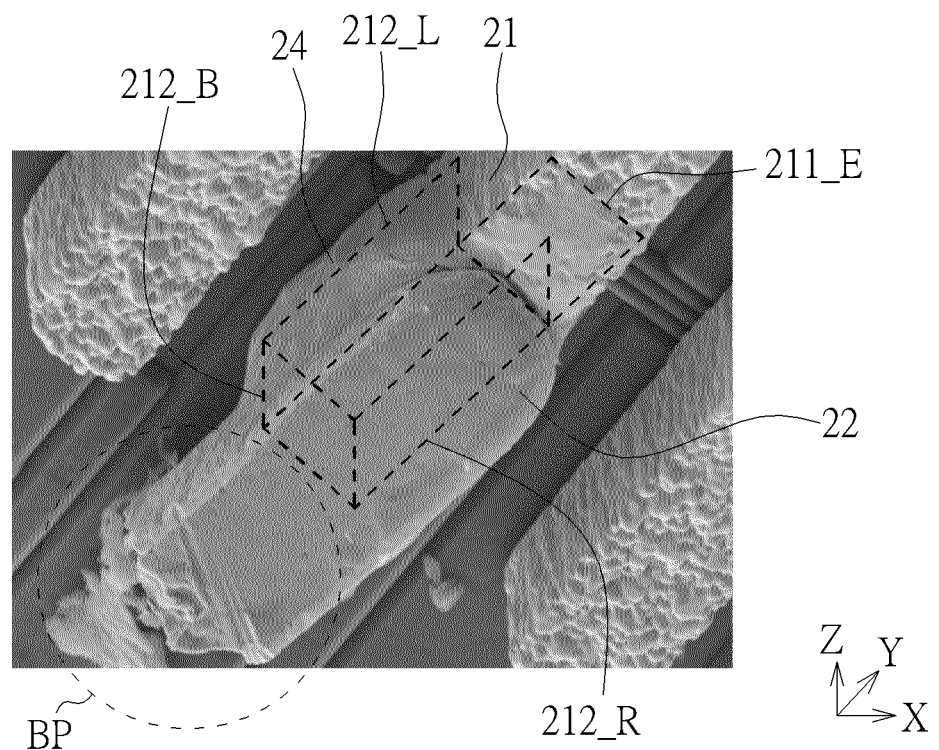
FIG. 3 illustrates a stretch experiment result after the lead bonding according to an embodiment of the present invention.

FIG. 3 illustrates a stretch experiment result after the lead bonding according to an embodiment of the present invention. As can be seen from FIG. 3, in addition to the bonding surfaces of the lead 22 and the gold bump 21 (i.e., the first bonding surface 211 and the second bonding surface 221), the side walls 212_R, 212_L and 212_B of the gold bump 21 and an extended area 211_E of the bonding surface 211 are covered by the eutectic material coverage 24 due to a capillary effect.

In detail, the surface of the gold bump 21 is rough to be a non-smooth surface, the capillary effect happens when the eutectic material coverage 24 in liquid state is formed on the surface of the gold bump 21, and the eutectic material coverage 24 in liquid state flows toward the side walls 212_R, 212_L and 212_B of the gold bump 21 and the extended area 211_E of the first bonding surface 211 to increase an area of the eutectic material coverage 24 and the bonding strength of the lead 22 and the gold bump 21. Further, since the area of the eutectic material coverage 24 covering the gold bump 21 is increased, a hardness of the gold bump 21 is also increased to mitigate deformation to the gold bump 21 after the bonding process and reduce short risk. Meanwhile, interface impedance between the lead 22 and the gold bump 21 decreases as the area of the eutectic material coverage 24 increases to improve conductivity between the lead 22 and the gold bump 21. Moreover, thermal expansion effect becomes less significant when the size of the gold bump 21 is decreased, which increases packaging tolerance and yield rate.

As can be seen from FIG. 3, the stretch experiment is to apply an external force to separate the gold bump 21 from the lead 22, the experiment result indicates that the lead 22 is broken by the external force and a break point BP is outside of the eutectic material coverage 24. Therefore, the bonding strength of the lead 22 and the gold bump 21 is stronger than a tensile strength of the lead 22. Moreover, since the surface of the gold bump 21 is rough, and the eutectic material coverage 24 covers the contact surface and the side walls of the gold bump 21 without flowing to the lead 22 (to prevent the lead 22 from short to another). In other words, under the condition that the width of the lead 22 is substantially greater than the width of the gold bump 21, the short risk to the lead 22 may be prevented.

Figure 4:
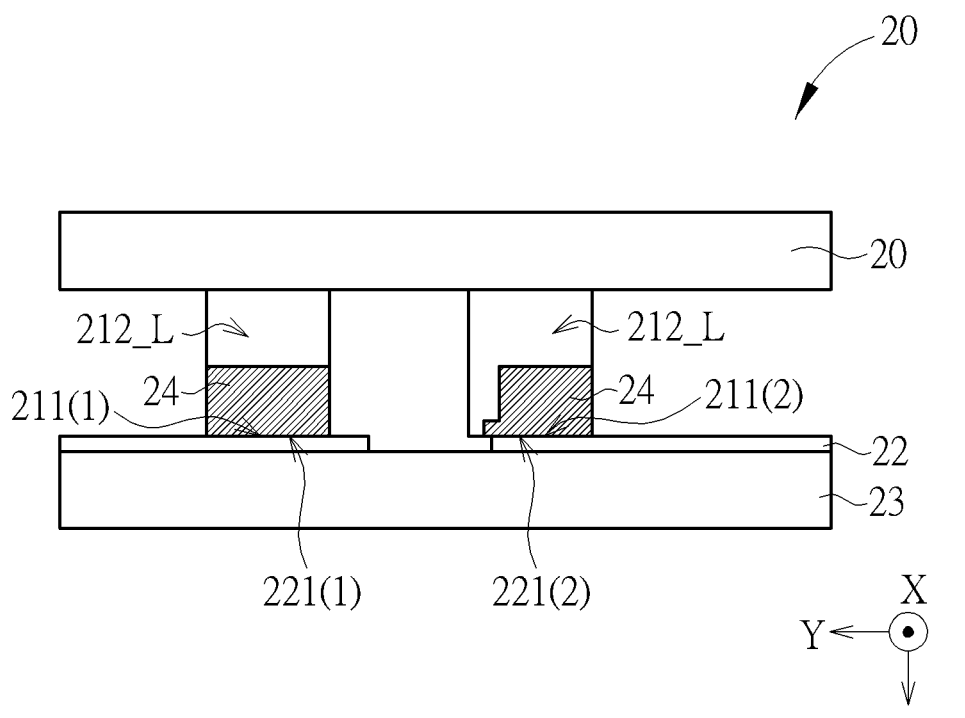
FIG. 4 illustrates a second perspective view (along an X direction) of the chip packaging structure of FIG. 2 performing lead bonding onto a YZ plane according to an embodiment of the present invention.
Figure 5:
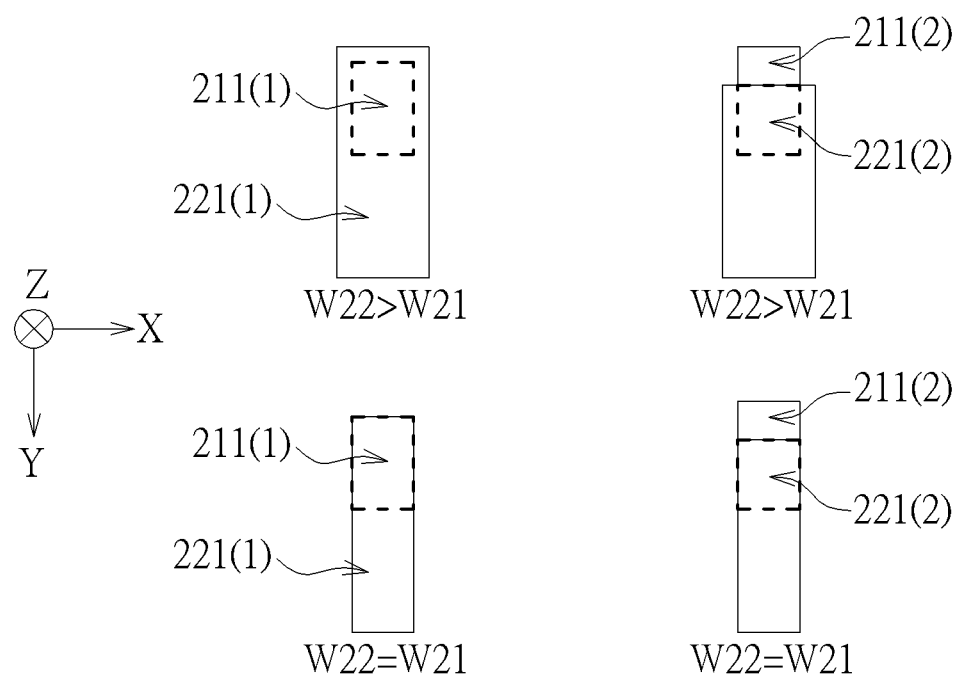
FIG. 5 illustrates a third perspective view (along a Z direction) of the chip packaging structure of FIG. 2 onto an XY plane according to an embodiment of the present invention.

FIG. 4 illustrates a second perspective view (along the X direction) of the chip packaging structure 2 performing lead bonding onto the YZ plane according to an embodiment of the present invention. FIG. 5 illustrates a third perspective view (along the Z direction) of the chip packaging structure 2 according to an embodiment of the present invention. As shown in FIG. 4 and FIG. 5, projections of the second bonding surface 221 (1) of the lead 22 and the first bonding surface 211 (1) of the gold bump 21 onto the XY plane are completely overlapped; or, projections of the second bonding surface 221 (1) of the lead 22 and the first bonding surface 211 (1) of the gold bump 21 onto the XY plane are partially overlapped. The bonding strength is maintained due to the side wall 212 of the gold bump 21 being covered by the eutectic material coverage 24 when the first bonding surface 211 (2) and the second bonding surface 221 (2) are partially overlapped.

Figure 6:
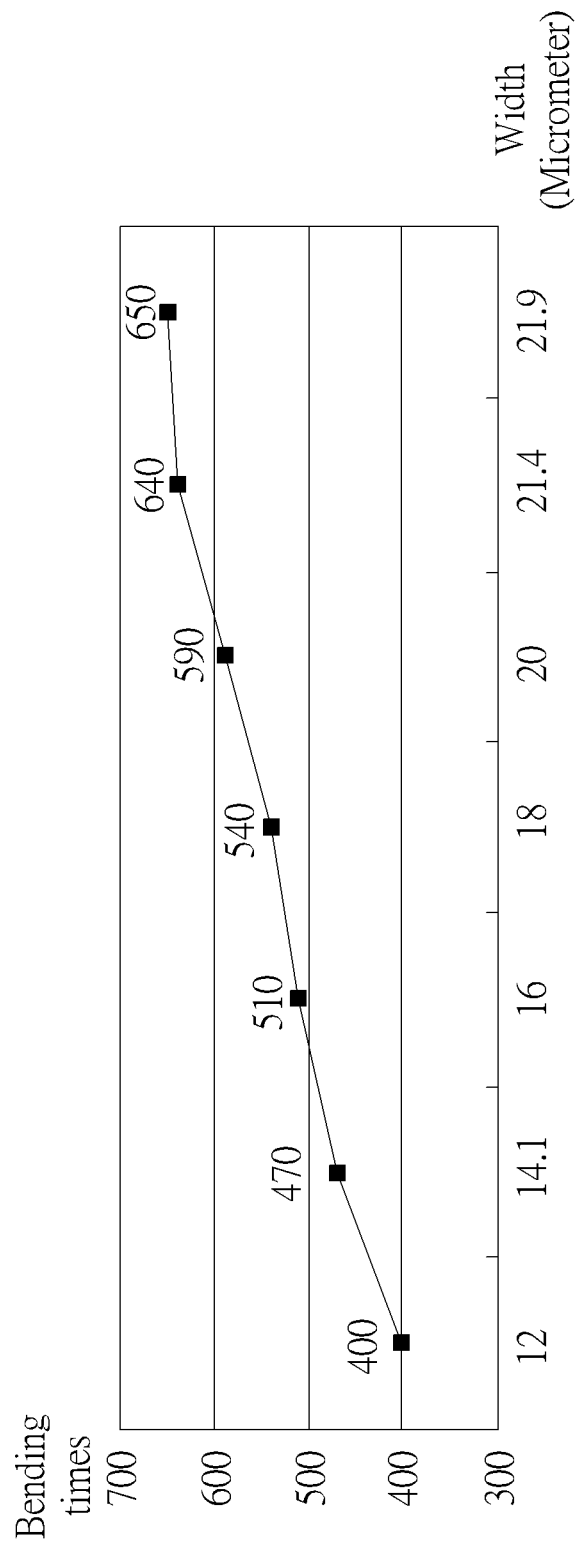
FIG. 6 illustrates an exemplary relationship chart between the lead width and bending times.

FIG. 6 illustrates an exemplary relationship chart between the lead width and bending times. Given that the substrate area and the number of leads are fixed, the lead width is greater and the mechanical strength and bending resistivity of the lead are greater as the lead pitch becomes smaller. In FIG. 6, the bending times is increased from 400 times to 650 times when the lead width is increased from 12 micrometers to 21.9 micrometers. Therefore, the mechanical strength and the bending times of the lead are improved when the lead width is increased.

Figure 7:
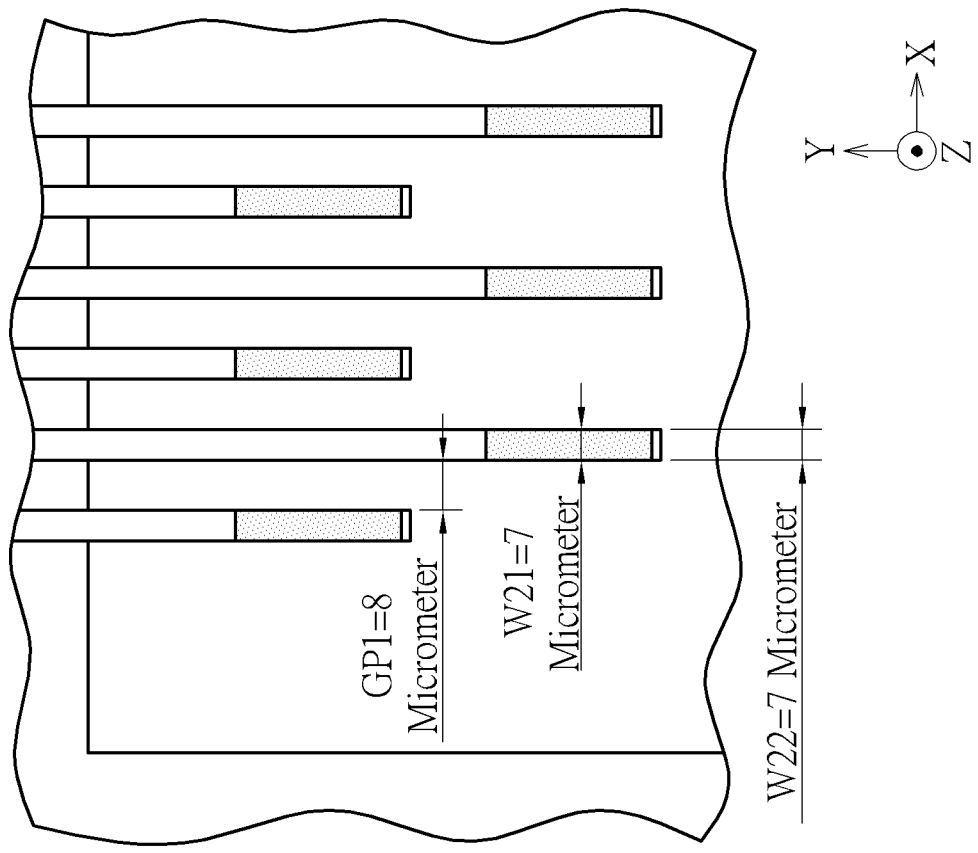
FIG. 7 illustrates a comparison between two spatial configurations of the gold bump and the lead.
Figure 7:
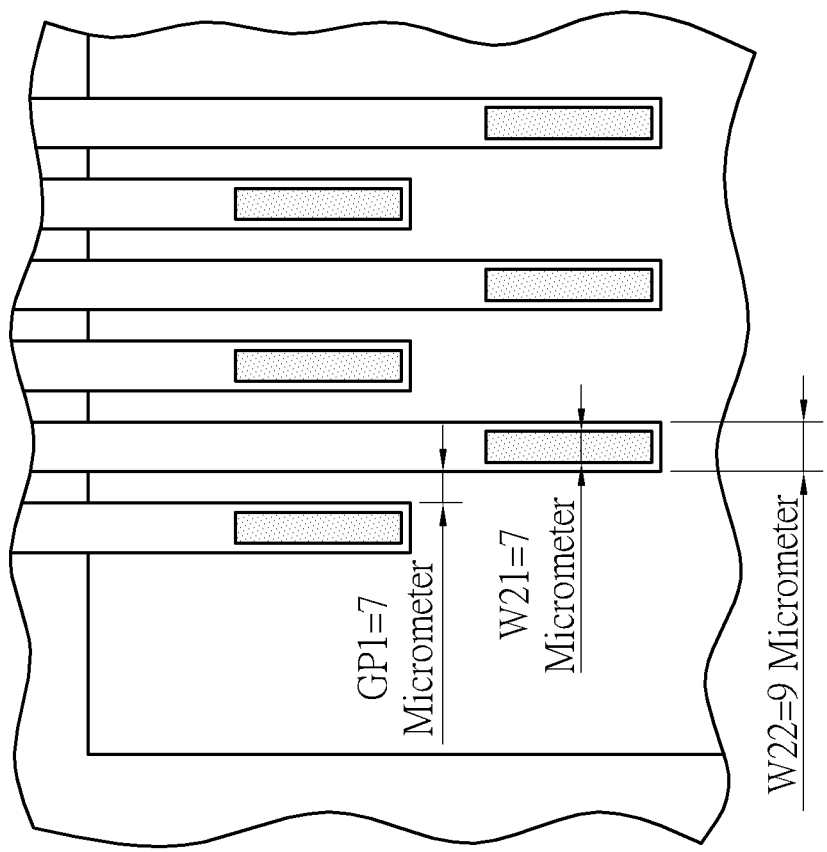

FIG. 7 illustrates a comparison between two spatial configurations of the gold bump and the lead. In practice, considering the precision of packaging process of the lead bonding and the production tolerance of the gold bump and the lead, in general, an edge of the inner lead corresponding to the inner gold bump shall be distant from an edge of the outer gold bump by at least 6 micrometers to avoid short risk due to packaging process drift.

According to FIG. 2, in the chip packaging structure 2 of the present invention, the width W21 of the gold bump 21 is substantially smaller than or equal to the width W22 of the lead 22, which means that decreasing the width W21 of the gold bump 21 is benefit to increasing a distance between the lead 22 corresponding to the gold bump 21 and an edge of an adjacent gold bump. Specifically, in one embodiment, a distance GP1 between edges of the lead and the outer gold bump is 7 micrometers when the width W21 of the gold bump 21 is substantially smaller than the width W22 of the lead 22 (e.g., the gold bump width W21 is 7 micrometers, and the lead width W22 is 9 micrometers), which avoids short risk due to packaging process drift. In another embodiment, a distance GP2 between edges of the lead and the outer gold bump is 8 micrometers when the width W21 of the gold bump 21 is substantially equal to the width W22 of the lead 22 (e.g., the gold bump width W21 is 7 micrometers, and the lead width W22 is 7 micrometers), which avoids short risk due to packaging process drift.

Figure 8:
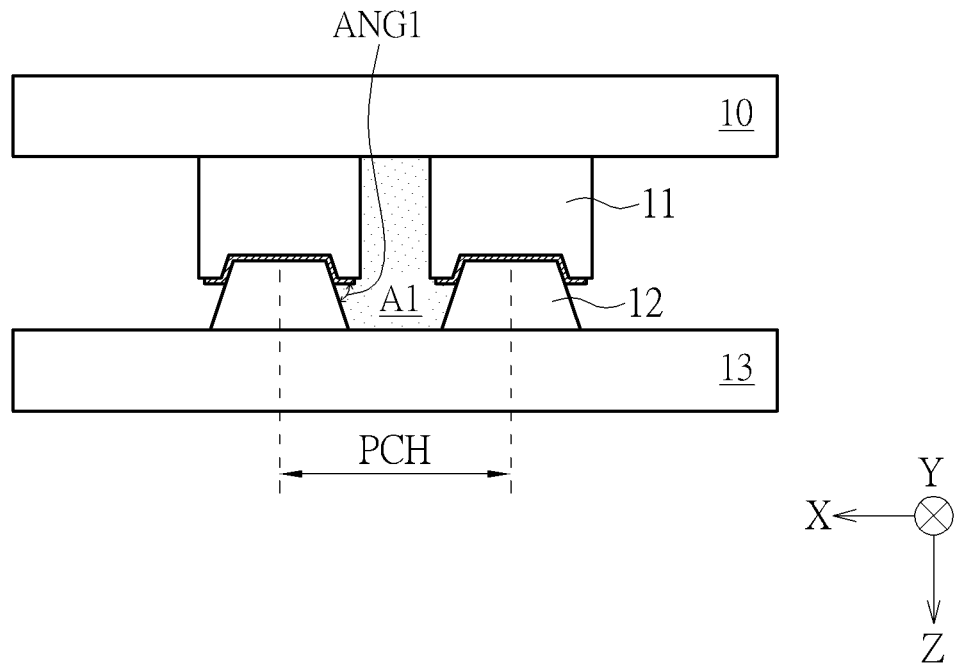
FIG. 8 illustrates a flipped first perspective view of the chip packaging structure of FIG. 1 onto the XZ plane according to the prior art.
Figure 9:
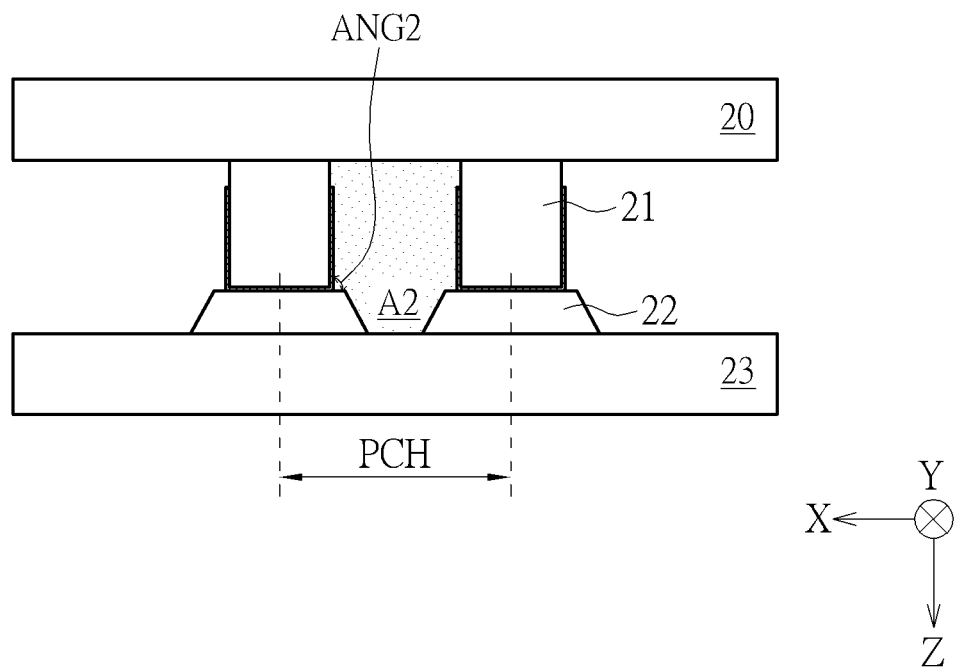
FIG. 9 illustrates a flipped first perspective view of the chip packaging structure of FIG. 2 onto the XZ plane according to an embodiment of the present invention.

FIG. 8 illustrates a flipped first perspective view of the chip packaging structure 1 onto the XZ plane according to the prior art, FIG. 9 illustrates a flipped first perspective view of the chip packaging structure 2 onto the XZ plane according to an embodiment of the present invention. In FIG. 8, the width of the gold bump 11 is greater than the width of the lead 12; in FIG. 9, the width of the gold bump 21 is smaller than the width of the lead 22.

Compare FIG. 8 and FIG. 9, under a same pitch PCH, a cross-sectional area A1 between two leads 12 of the chip packaging structure 1 is smaller than a cross-sectional area A2 between two leads 22 of the chip packaging structure 2; in addition, the shape of the cross-sectional area A1 is sharper than the shape of the cross-sectional area A2 (e.g., an angle ANG1 at where the gold bump 11 and the lead 12 are bonded is smaller than 90 degrees while an angle ANG2 at where the gold bump 21 and the lead 22 are bonded is greater than 90 degrees). Moreover, a space for heat dissipation of the chip packaging structure 2 is greater than that of the chip packaging structure 1 because the cross-sectional area A2 is greater than the cross-sectional area A1, thereby the capability for heat dissipation is improved.

In addition, the width of the gold bump 21 is smaller than the width of the gold bump 11 (i.e., the sizes along the X direction), and the height of the lead 22 is greater than the height of the lead 12 (i.e., the sizes along the Z direction), which saves material usages (e.g., gold and copper) to make the chip packaging structure 2 more cost competitive. The height of the lead 22 is smaller than the height of the lead 12 (i.e., the sizes along the Z direction), and thus a distance between the lead 22 and the chip 20 is greater than a distance between the lead 12 and the chip 10, which reduces short risk due to test key burr when the chip packaging structure 2 is performing packaging test.

Figure 10:
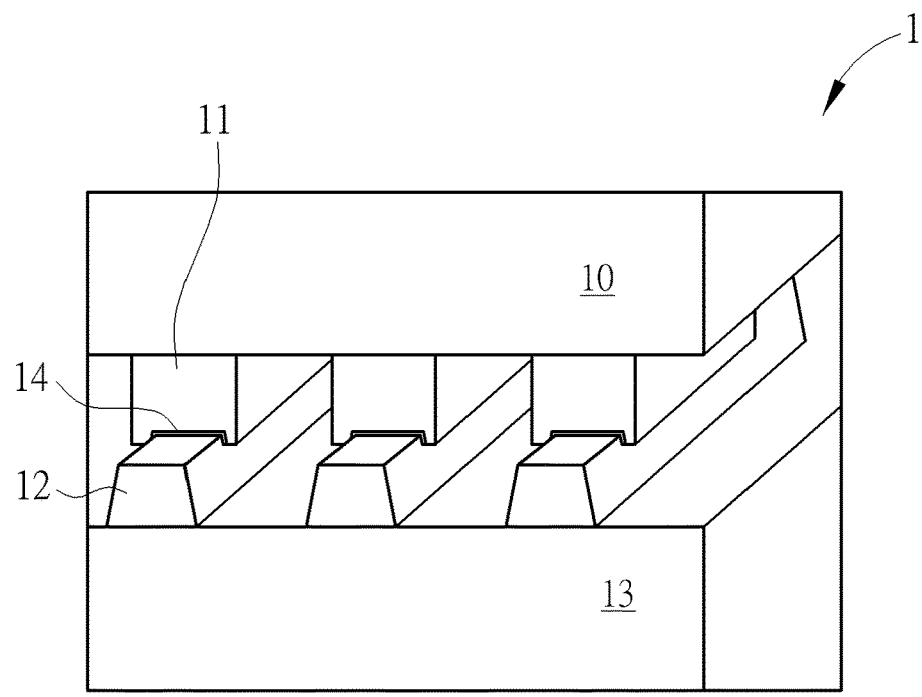
FIG. 10 illustrates an isotropic view of the conventional chip packaging structure of FIG. 1.

FIG. 10 illustrates an isotropic view of the conventional chip packaging structure 1. As shown in FIG. 10, during a potting process, since the shape of the cross-sectional area A1 of the chip packaging structure 1 is complicated, turbulences may be generated when the potting glue encounters corners or slips to cause bad fluidity of the potting glue and leave bobbles in the chip packaging structure 1.

Figure 11:
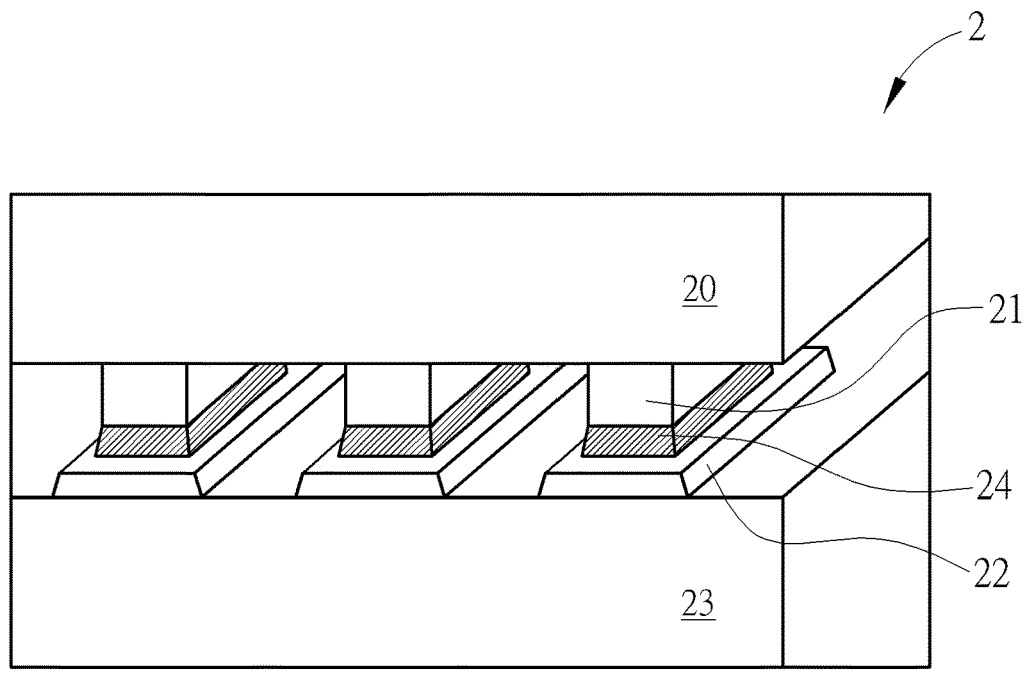
FIG. 11 illustrates an isotropic view of the chip packaging structure of FIG. 2 according to an embodiment of the present invention.

FIG. 11 illustrates an isotropic view of the chip packaging structure 2 according to an embodiment of the present invention. As shown in FIG. 11, in comparison, since the cross-sectional area A2 of the chip packaging structure 2 is greater and smoother, it is able to provide greater space for fluidity to reduce stay bobbles in the chip packaging structure 2, so as to improve the uniformity of potting resin.

Figure 12:
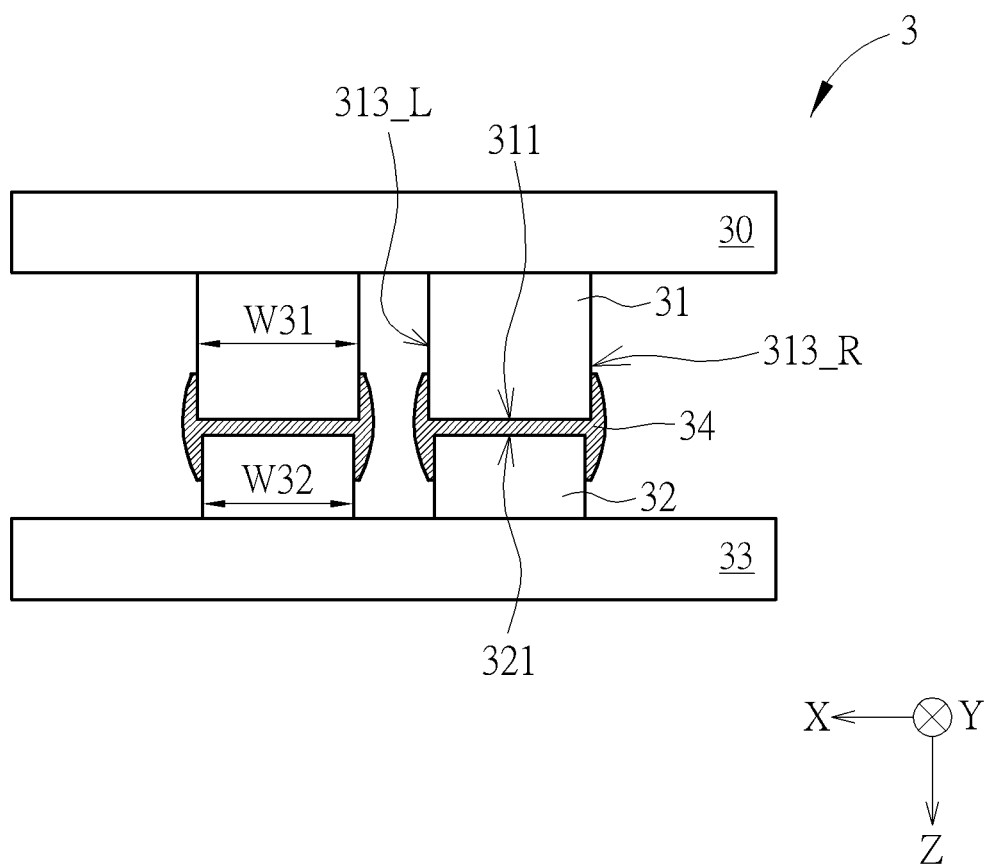
FIG. 12 illustrates a first perspective view (along the Y direction) of a chip packaging structure onto the XZ plane according to an embodiment of the present invention.

FIG. 12 illustrates a first perspective view (along the Y direction) of a chip packaging structure 3 onto the XZ plane according to an embodiment of the present invention. The chip packaging structure 3 includes a chip 30, a gold bump 31, a lead 32 and film substrate 33. The gold bump 31 includes a first bonding surface 311 and a plurality of side walls 313_L and 313_R, wherein each of the side walls 313_L and 313_R is connected to the first bonding surface 311 and is a surface of the gold bump 31. The lead 32 includes a second bonding surface 321.

A eutectic material coverage 34 is formed between the gold bump 31 and the lead 32, and a part of the gold bump 31 and a part of the lead 32 may be combined with the eutectic material coverage 34 through heating up for a period to form alloys of eutectic material. The gold bump 31 may be electrically connected to the lead 32 through the eutectic material coverage 34, and the first bonding surface 311, the second bonding surface 321 and at least one of the plurality of side walls 33 are covered by the eutectic material coverage 34.

Noticeably, a width W31 of the gold bump 31 and a width W32 of the lead 32 are sizes along the X direction. In this embodiment, the width W31 of the gold bump 31 is greater than the width W32 of the lead 32. By properly controlling a difference between the widths W31 and W32, the non-embedded bonding may be realized to make the first bonding surface 311, the second bonding surface 321 and at least one of the plurality of side walls 313_L and 313_R covered by the eutectic material coverage 34.

Figure 13:
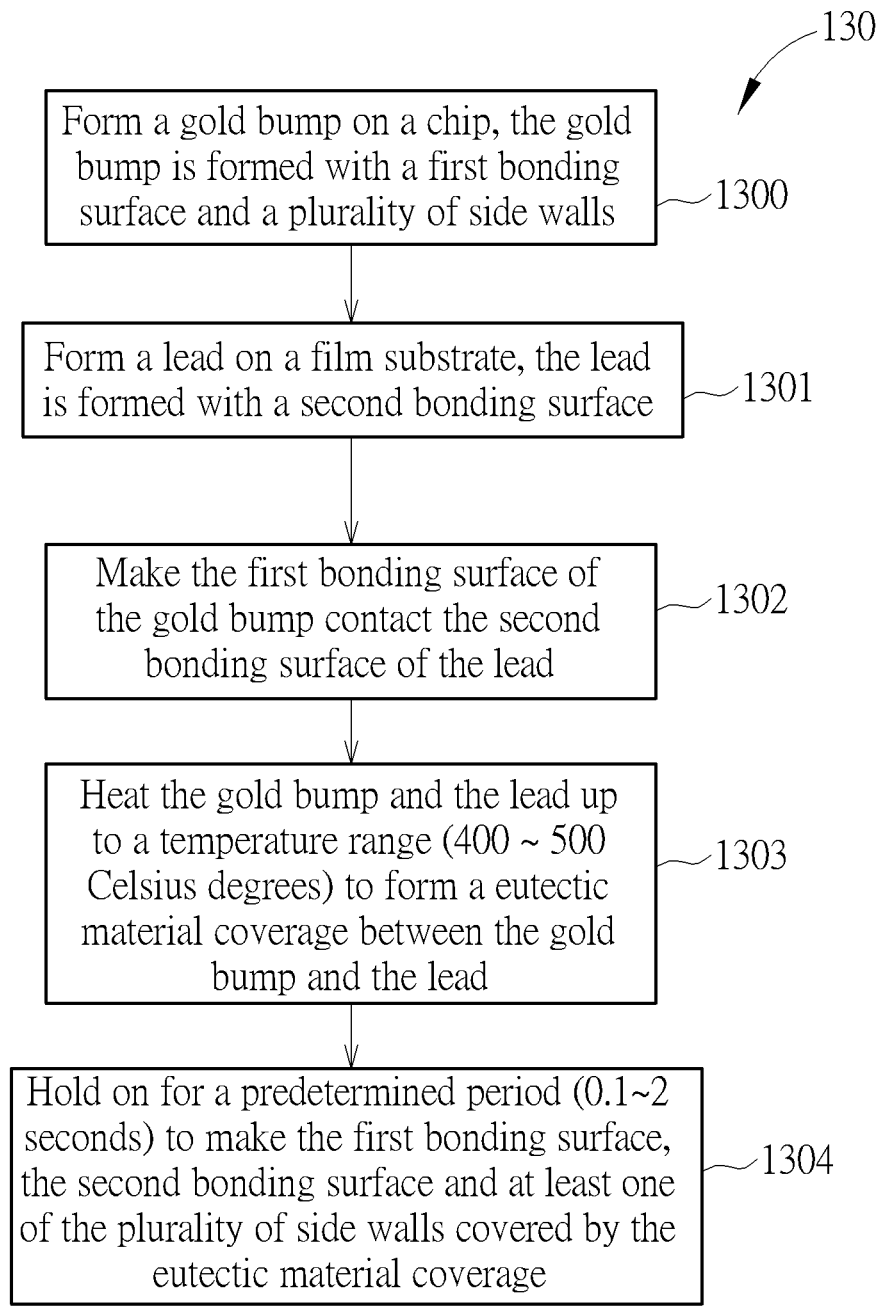
FIG. 13 is a flowchart of a lead bonding process according to an embodiment of the present invention.

Production processes regarding the chip packaging structure 2 or 3 may be summarized into a lead bonding process 130, as shown in FIG. 13, wherein the lead bonding process 130 includes the following steps.

Step 1300: Form a gold bump on a chip, the gold bump is formed with a first bonding surface and a plurality of side walls.

Step 1301: Form a lead on a film substrate, the lead is formed with a second bonding surface.

Step 1302: Make the first bonding surface of the gold bump contact the second bonding surface of the lead.

Step 1303: Heat the gold bump and the lead up to a temperature range (400-500 Celsius degrees) to form a eutectic material coverage between the gold bump and the lead.

Step 1304: Hold on for a predetermined period (0.1-2 seconds) to make the first bonding surface, the second bonding surface and at least one of the plurality of side walls covered by the eutectic material coverage.

Detailed operations of the lead bonding process 130 may be obtained by referring to descriptions of FIG. 2, which is omitted.

To sum up, The present invention utilizes a capillary effect happened to the eutectic material coverage 24 formed on the surface of the gold bump, which allows the eutectic material coverage flowing to the bonding surface and at least one side walls of the gold bump without any applied stress to increase the area of eutectic material coverage. Therefore, the present invention realizes non-embedded bonding to improve bonding strength between the lead and the gold bump, reduce bonding impedance, enhance resistance to deformation, ensure structure intactness, and reduce short risk. Moreover, in the chip packaging structure of the present invention, the sizes of the lead and the gold bump are decreased to realize fine pitch, improve potting glue fluidity, increase space for heat dissipation, save material usage, increase packaging precision (tolerance) and decrease short risk due to test pin burr.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lead bonding method for a chip packaging structure, wherein the chip packaging structure comprises a chip and a film substrate, comprising:
    making a first bonding surface of a gold bump of the chip contact with a lead of the film substrate, wherein a width of the gold bump is smaller than a width of the lead, and wherein at least the first bonding surface or one of a plurality of side walls of the gold bump is a non-smooth surface;
    heating the gold bump and the lead up to a temperature range to form a eutectic material coverage between the gold bump and the lead, wherein the temperature range is from 400 to 500 Celsius degrees; and
    holding on for a predetermined period to make the first bonding surface and at least one of the plurality of side walls of the gold bump covered by the eutectic material coverage.

2. The lead bonding method of claim 1, further comprising:
    forming the gold bump on the chip; and
    forming the lead on the film substrate.

3. The lead bonding method of claim 1, wherein the lead and the gold bump extend along a first direction, the gold bump contacts with the lead toward a second direction, the width of the gold bump and the width of the lead are sizes along a third direction, and the first direction, the second direction and the third direction are perpendicular to one another.

4. The lead bonding method of claim 1, wherein the lead comprises a second bonding surface, the second bonding surface faces toward the first bonding surface of the gold bump, and the eutectic material coverage covers the second bonding surface.

5. The lead bonding method of claim 4, wherein the second bonding surface and the first bonding surface are parallel to a first plane, projections of the second bonding surface and the first bonding onto the first plane are partially or completely overlapped, the plurality of side walls is parallel to a second plane, and the first plane is perpendicular to the second plane.

6. The lead bonding method of claim 3, wherein the second bonding surface and the first bonding surface are parallel to a first plane, the plurality of side walls is parallel to a second plane, the first plane is perpendicular to the second plane, and the plurality of side walls comprises:
   a first side wall connected to the first bonding surface, perpendicular to the first bonding surface and the third direction; and
   a second side wall connected to the first bonding surface, perpendicular to the first bonding surface and the third direction, and the first side wall and the second side wall are covered by the eutectic material coverage.

7. The lead bonding method of claim 6, wherein the gold bump comprises:
   a third side wall connected to the first bonding surface, the first side wall and the second side wall, perpendicular to the first bonding surface and the first direction, and covered by the eutectic material coverage.

8. The lead bonding method of claim 1, wherein the predetermined period is from 0.1 to 2 seconds.

9. The lead bonding method of claim 1, wherein the first bonding surface and the at least one of the plurality of side walls are covered by the eutectic material coverage by a capillary effect, and a maximum width of the gold bump is smaller than a width of the lead.

10. A chip packaging structure made by the lead bonding method of claim 1.

* * * * *